United States Patent
Yamaguchi (10) Patent No.: US 9,496,129 B2
(45) Date of Patent: Nov. 15, 2016

(54) METHOD FOR MANUFACTURING A CIRCULAR WAFER BY POLISHING THE PERIPHERY, INCLUDING A NOTCH OR ORIENTATION FLAT, OF A WAFER COMPRISING CRYSTAL MATERIAL, BY USE OF POLISHING TAPE

(71) Applicant: Mipox Corporation, Tachikawa-shi (JP)

(72) Inventor: Naohiro Yamaguchi, Kawasaki (JP)

(73) Assignee: Mipox Corporation, Tachikawa-shi (JP)

( * ) Notice: Subject to any disclaimer, the term of this patent is extended or adjusted under 35 U.S.C. 154(b) by 0 days.

(21) Appl. No.: 14/794,984

(22) Filed: Jul. 9, 2015

(65) Prior Publication Data

US 2016/0005593 A1 Jan. 7, 2016

Related U.S. Application Data

(63) Continuation of application No. PCT/JP2014/050097, filed on Jan. 8, 2014.

(30) Foreign Application Priority Data

Feb. 13, 2013 (JP) .................................. 2013-025344

(51) Int. Cl.
*B24B 9/00* (2006.01)
*H01L 21/02* (2006.01)
(Continued)

(52) U.S. Cl.
CPC ... *H01L 21/02021* (2013.01); *H01L 21/30625* (2013.01); *H01L 22/12* (2013.01); *H01L 22/20* (2013.01)

(58) Field of Classification Search
CPC ....... B24B 37/042; B24B 1/00; B24B 7/228; B24B 21/04; B24B 27/0076; B24B 9/065; B24B 9/10; H01L 21/02021; H01L 1/00; H01L 9/12

USPC ............................................ 451/44, 57, 5, 6
See application file for complete search history.

(56) References Cited

U.S. PATENT DOCUMENTS

| 4,638,601 A | 1/1987 | Steere et al. |
| 5,271,185 A * | 12/1993 | Hosokawa ............ B24B 9/065 451/136 |

(Continued)

FOREIGN PATENT DOCUMENTS

| JP | H05217830 | 8/1993 |
| JP | H10100050 | 4/1998 |

(Continued)

OTHER PUBLICATIONS

International Search Report for corresponding application PCT/JP2014/050097 dated Apr. 15, 2014, 2 pages.

*Primary Examiner* — George Nguyen
(74) *Attorney, Agent, or Firm* — Lipsitz & McAllister, LLC (57) ABSTRACT

Provided is a method for producing a circular wafer using a grinding tape to grind the edge of a wafer comprising a crystalline material. A primary grinding step is provided for contacting a grinding body to the peripheral portion of a wafer placed centered on a horizontal stage and rotating the stage, thus grinding the peripheral portion. The radius of the wafer is measured, and a radius is set that is no greater than the measured smallest radius, and the difference $\Delta r$ between the set radius and the measured wafer radius along the peripheral portion is determined. The portions of the peripheral portion at which $\Delta r$ is greater than a predetermined value are determined and a secondary grinding step is provided for contacting the peripheral portion and the grinding body, rotating the stage forwards and backwards in a predetermined range of rotational angles, and grinding the peripheral portion.

12 Claims, 8 Drawing Sheets

(51) Int. Cl.
*H01L 21/66* (2006.01)
*H01L 21/306* (2006.01)

(56) References Cited

U.S. PATENT DOCUMENTS

| | | | |
|---|---|---|---|
| 6,267,648 B1* | 7/2001 | Katayama | B24B 9/065 257/E21.237 |
| 7,376,482 B2 | 5/2008 | Ido | |
| 8,029,333 B2 | 10/2011 | Takahashi et al. | |
| 2005/0078312 A1* | 4/2005 | Fukuzaki | H01L 21/68 356/399 |
| 2006/0252355 A1* | 11/2006 | Kumasaka | B24B 9/065 451/44 |
| 2006/0287756 A1 | 12/2006 | Ido | |
| 2009/0004952 A1* | 1/2009 | Takahashi | B24B 9/065 451/44 |
| 2009/0017731 A1* | 1/2009 | Ettinger | B24B 9/065 451/44 |
| 2009/0017733 A1 | 1/2009 | Takahashi et al. | |
| 2009/0036033 A1* | 2/2009 | Wasinger | B24B 1/04 451/44 |
| 2009/0093192 A1 | 4/2009 | Takahashi et al. | |
| 2009/0311948 A1* | 12/2009 | Hashii | B24B 7/17 451/44 |
| 2010/0022166 A1* | 1/2010 | Kimba | B24B 9/065 451/5 |
| 2010/0112909 A1 | 5/2010 | Yamaguchi et al. | |

FOREIGN PATENT DOCUMENTS

| | | |
|---|---|---|
| JP | 2006303112 | 11/2006 |
| JP | 2007000945 | 1/2007 |
| JP | 2008537317 | 9/2008 |
| JP | 4463326 | 5/2010 |

* cited by examiner

METHOD FOR MANUFACTURING A CIRCULAR WAFER BY POLISHING THE PERIPHERY, INCLUDING A NOTCH OR ORIENTATION FLAT, OF A WAFER COMPRISING CRYSTAL MATERIAL, BY USE OF POLISHING TAPE

This application is a continuation of International application no. PCT/JP2014/050097 filed on Jan. 8, 2014 and claims the benefit of Japanese application no. 2013-025344 filed on Feb. 13, 2013, which are incorporated herein by reference in their entirety and for all purposes.

TECHNICAL FIELD

The present invention relates to a method for polishing the periphery of a wafer comprising crystal material. More particularly, the present invention relates to a method for manufacturing a circular wafer having improved handling properties by providing the periphery with excellent surface properties by use of a polishing tape.

BACKGROUND ART

In recent years, various kinds of wafers used in the manufacture of semiconductors, MEMS and the like have tend become thinner, with thicknesses between tens of micrometers to 1 mm, due to the increased density and the reduced thickness of circuit elements. A wafer is cut out from an ingot. Then the bevel part or edge part of the wafer is chamfered. The main face of the wafer is polished to a mirror-finish face. However, due to the reduced thickness of wafers, minute chipping or wafer cracking due to such chipping has become more likely to occur. For improving yield in manufacture of semiconductors and the like, a machined state of the wafer periphery has become important.

Heretofore, a chamfering method for wafers was provided as suitable for high integration of semiconductor integrated circuits (JP-A-H10-100050: patent document 1). The method involves pressing a cylindrical or columnar grindstone against the chamfering portion of the wafer consisting of an orientation flat (hereinafter, when appropriate, referred to as the OF), an outer periphery and a corner, by a predetermined pressing force while rotating the grindstone and the wafer relative to each other; soft-grinding the OF, the outer periphery and the corner, respectively, while changing the rotation speed of the wafer depending on whether the part subjected to the soft-grinding is the OF, the outer periphery or the corner; and then polishing the OF, the outer periphery and the corner, respectively, so as to perform uniform soft-grinding over the entire chamfering portion.

And heretofore, a method and an apparatus for polishing a notch and a bevel of a semiconductor wafer by use of a polishing tape was provided (JP-A-2006-303112: patent document 2).

CITATION LIST

Patent Document

Patent Document 1: JP-A-H10-100050
Patent Document 2: JP-A-2006-303112
Patent Document 3: JP Patent 4463326

SUMMARY OF INVENTION

Problems to be Solved by the Invention

When using the grindstone to chamfer a wafer comprising crystal material high in cleavage property, the mechanical impact is so large as to easily cause chipping or cracking in the chamfered portion, and the resulting state of the chamfered portion is not sufficient. The problem has been that, when polishing the main face of the wafer into a mirror-finish face, cracking is easily caused by such chipping or other flaws.

By using the polishing tape to polish the wafer periphery, even minute chipping too small to be visible to the naked eye can be removed from the edge part, thereby enabling high-precision chamfering. However, the conventional method using the polishing tape has had problems in that a rollover is easily generated on one end of the OF (a boundary portion between the circular-arc part and the OF) and that the roundness of the wafer is reduced because the polishing rate varies between the crystal azimuth and the crystal plane of the wafer. In particular, when the periphery of a wafer comprising a soft compound material is polished with the polishing tape, the outer diameter of the wafer easily becomes nonuniform, and therefore the centering accuracy of the wafer is reduced in subsequent manufacturing steps, resulting in failure to sufficiently meet the specification.

In view of the aforementioned problems, it is the object of the present invention to provide a method for manufacturing a circular wafer which sufficiently meets the specification by precisely polishing the periphery of a disc-shaped wafer comprising a crystal material without reducing the roundness of the wafer, by use of a polishing tape, the wafer having an orientation flat (OF) or a notch indicating the crystal azimuth.

Solution to Problem

Provided herein in one embodiment of the present invention to solve the above problems is a method for manufacturing a circular wafer by polishing the periphery of a disc-shaped wafer comprising a crystal material, by use of a polishing tape, the periphery having an orientation flat and a periphery part. The method comprises a primary polishing step for polishing the periphery part of a wafer centered on a horizontal wafer stage having a vertical rotation axis by rotating the wafer stage with the periphery part and a polishing element being brought into contact with each other; a determining step for determining differences Δr between measured radiuses and a set radius along the periphery part, the measured radiuses being obtained by measuring the radiuses of the wafer subjected to the primary polishing along the periphery part, the set radius being less than or equal to the minimum radius among the measured radiuses; a determining step for determining portions of the periphery part of the wafer subjected to the primary polishing where the portions have Δr greater than a predetermined value; and a secondary polishing step for polishing the periphery part subjected to the primary polishing, by rotating the wafer stage forward and backward about the rotation axis in the range of a predetermined rotation angle, with the periphery part of the wafer subjected to the primary polishing and a polishing element being brought into contact with each other; wherein the polishing element comprises a polishing tape disposed on a flat polishing pad to define a flat polishing surface, and wherein, in the secondary polishing step, the orientation flat is not parallel to the polishing surface, the wafer stage and the polishing surface are relatively oscillated along a horizontal axis, and the speed of the forward or backward rotation of the wafer stage is reduced in the range of a rotation angle corresponding to the determined portion of the periphery part of the wafer.

By polishing the wafer periphery having the OF and the periphery part as described above, nonuniformity in the polishing rate due to such factors as crystal azimuth in the periphery part of the wafer can be substantially reduced. And, in the polishing step, the wafer stage is rotated forward and backward, preventing the polishing element from being intermittently brought into contact with the wafer periphery, thereby enabling uniform polishing. Polishing with the wafer being rotated forward and backward is performed at least in the secondary polishing step, and it may be performed in both the primary and secondary polishing steps.

The wafer may comprise a silicon material (Si, SOI, monocrystalline silicon, polycrystalline silicon), a compound material (such as GaN, SiC, GaP, GaAs, GaSb, InP, InAs, InSb, ZnS and ZnTe), an oxide material (such as LiTaO3 (LT), LiNbO3 (LN), Ga2O3, MgO, ZnO, sapphire and quartz crystal) or a glass material (such as soda lime, alkali free, borosilicate, crown glass, silicic acid (silica) and quartz). The wafer may be a semiconductor wafer.

A circular wafer may be a true circle wafer. A circular wafer may be a circle wafer with the acceptable range of error for each wafer size as standardized by industry groups such as SEMI (Semiconductor Equipment and Materials International). Also, a circular wafer may be a circle wafer with a certain range of error that meets other specifications for each wafer size, material, and the like.

Preferably, at least in the secondary polishing step, the wafer stage is rotated forward and backward in the range of a rotation angle such that a portion of the circular-arc periphery part of the wafer is formed into a linear shape. Such rotation angle may be defined by both ends of the OF and the center of the wafer. Alternatively, such rotation angle may be defined by two points located on the periphery part near both ends of the OF, respectively, and the center of the wafer. In this embodiment, in order to remove the linearly formed portion of the periphery part, it is preferable to further polish the OF by bringing the OF and the polishing surface into contact with each other while linearly oscillating the OF and the polishing surface relative to each other along a horizontal axis. Thus, a circular wafer with sufficient roundness can be obtained.

It is preferable that the OF length, etc., of the circular wafer obtained in the aforementioned way meets SEMI standards or some machining specification.

In the secondary polishing step, the wafer stage may be rotated forward and backward in the range of a rotation angle such that the entire circular-arc periphery part of the wafer is formed into a circular-arc shape. In this embodiment, it is preferable to prevent the polishing element from being intermittently brought into contact with the wafer periphery by means of applying an appropriate pressing force or the like.

Another embodiment of the present invention provides a method for manufacturing a circular wafer by polishing the periphery of a disc-shaped wafer comprising a crystal material by use of a polishing tape, the periphery having an orientation flat and a periphery part. The method comprises polishing the periphery part of a wafer centered on a horizontal wafer stage having a vertical rotation axis, by rotating the wafer stage forward and backward about the rotation axis in the range of a predetermined rotation angle, with the periphery part and a polishing element being brought into contact with each other, wherein the polishing element comprises a polishing tape disposed on a flat polishing pad to define a flat polishing surface, and wherein, in the polishing, the orientation flat is not parallel to the polishing surface, the wafer stage and the polishing surface are relatively oscillated along a horizontal axis, and the speed of the forward or backward rotation of the wafer stage is reduced in the range of a rotation angle corresponding to a predetermined portion of the periphery part of the wafer.

The portion of the periphery part of the wafer may be predetermined on the basis of differences $\Delta r$ between the set radius and measured radiuses as described above, the differences $\Delta r$ being obtained by, for example, executing a test polishing of one wafer. The primary polishing step of each wafer and the determining step for determining each portion of the periphery part can thereby be omitted to make it efficient to manufacture circular wafers when each wafer comprises the same crystal material (for example, when each wafer has been cut out from the same ingot) and nonuniformity in the polishing rate of the periphery is caused by the crystal azimuth.

Another embodiment of the present invention is a method for manufacturing a circular wafer by polishing the circular-arc periphery of a disc-shaped wafer comprising a crystal material by use of a polishing tape. This method comprises determining differences $\Delta r$ between measured radiuses and a set radius of a wafer along a circular-arc periphery, the measured radiuses being obtained by measuring radiuses of the wafer along the circular-arc periphery, the set radius being less than or equal to the minimum radius among the measured radiuses; determining a portion of the periphery of the wafer, the portion having $\Delta r$ greater than a predetermined value, and polishing the portion of the periphery of the wafer centered on a horizontal wafer stage having a vertical rotation axis by rotating the wafer stage forward and backward about the vertical rotation axis in the range of a rotation angle corresponding to the portion of the periphery, with the portion of the periphery and a polishing element being brought into contact with each other; wherein the polishing element comprises a polishing tape disposed on a flat polishing pad to define a flat polishing surface.

By the above embodiment, a circular wafer having the desired roundness can be manufactured.

Yet another embodiment of the present invention is a method for manufacturing a circular wafer by polishing the periphery of a disc-shaped wafer comprising a crystal material by use of a polishing tape, the periphery having an orientation flat and a periphery part. This method comprises polishing the periphery part of a wafer centered on a horizontal wafer stage having a vertical rotation axis by rotating the wafer stage forward and backward in the range of a predetermined rotation angle with the periphery part and a polishing element being brought into contact with each other, wherein the polishing element comprises a polishing tape disposed on a flat polishing pad to define a flat polishing surface, and wherein, in the polishing, the orientation flat is not parallel to the polishing surface.

By the above embodiment, the wafer periphery can be polished without a rollover caused near one end of the OF, thereby preventing degradation of roundness of the wafer and enabling manufacture of a circular wafer having excellent handling properties.

In the above polishing step, the wafer stage may be rotated forward and backward in the range of a rotation angle such that a portion of the circular-arc periphery part is formed into a linear shape.

It is preferable that the invention further comprises polishing of the orientation flat of the wafer by linearly oscillating the orientation flat and a polishing surface relative to each other along a horizontal axis while abutting them on each other. Thus, the portion formed into a linear shape can be removed and a circular wafer manufactured.

Alternatively, in the polishing step, the wafer stage may be rotated forward and backward in the range of a rotation angle such that the entire circular-arc periphery part of the wafer is formed into a circular-arc shape. In this embodiment, it is preferable that the polishing surface is pressed against the wafer periphery part through a polishing pad having an elasticity such that the polishing surface does not move away from the wafer periphery. The polishing pad can thereby be prevented from intermittently making contact with the wafer periphery, and thus degradation of roundness can be reduced.

Effects of the Invention

By the method for manufacturing a circular wafer of the present invention, the periphery, including the edge part or the bevel part, of the wafer can be machined with high precision, thereby preventing cracking of a wafer that has a thin profile (a thickness of 1 mm or less) or comprises a compound material. Furthermore, a circular wafer having a shape closer to complete roundness can be obtained, thereby improving processing accuracy in subsequent processes so as to improve yield in the manufacturing process of semiconductor devices and the like. Furthermore, according to the method for manufacturing a circular wafer of the present invention, a circular wafer having the desired roundness can be obtained in accordance with each specification.

BRIEF DESCRIPTION OF THE DRAWINGS

FIG. 1 (A) is a plan view of a wafer with an OF. FIG. 1 (B) is a cross-sectional view of the periphery of the wafer.

FIG. 4A (a) is a diagram schematically showing one embodiment of a forward and backward rotation angle according to the present invention. FIG. 4A (b) is a partially enlarged view of FIG. 4A (a).

BEST MODES FOR CARRYING OUT THE INVENTION

The following describes some features of the present invention with reference to preferred embodiments that are not intended to limit the invention. The drawings may be simplified or emphasized for the purpose of illustration, and the scale of the drawings may vary.

Figure 1A:
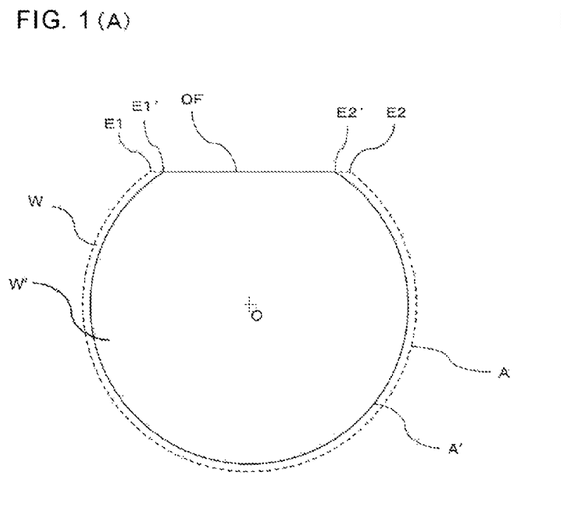

FIG. 1 (A) shows a wafer W having an orientation flat OF and a circular wafer W' obtained by polishing at least a portion of the periphery of the wafer W. The periphery of the wafer W comprises the linear OF and the circular-arc periphery part A. The boundaries between the linear OF and the circular-arc periphery part A are both ends E1 and E2 of the OF, respectively. Similarly, the periphery of the wafer W' comprises the linear OF and the circular-arc periphery A'. The boundaries between the linear OF and the circular-arc periphery part A' are both ends E1' and E2' of the OF, respectively. Generally, the wafer W' has a slightly smaller radius and shorter OF length than those of the wafer W.

Figure 1B:
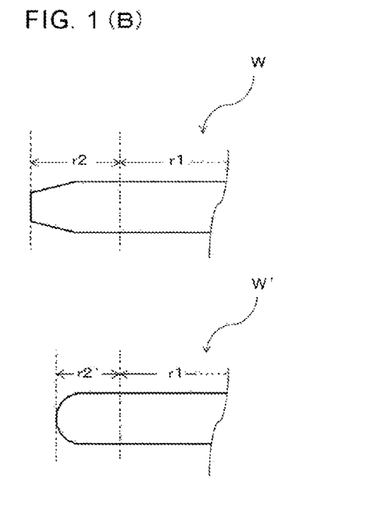

FIG. 1 (B) schematically shows cross-sectional views of the peripheries of wafers W and W', respectively. The wafer W, which has been cut out from an ingot, has damage such as film or residual matter on its periphery, including the edge/bevel part. Polishing is performed to remove that damage from the wafer. Using a polishing tape to perform the polishing makes it possible to provide the periphery with excellent surface property without chipping. The semiconductor device is formed on a portion r1 located radially inside the wafer W. A portion r2 (the edge or bevel part) located radially outside the wafer is the wafer periphery, which is not the product formation portion, and is polished to be formed into a periphery r2'. The radial length of r2' is smaller than r2. The radius of the wafer W' (r1+r2') is slightly smaller than that of the wafer W (r1+r2).

The cross-sectional shape of the periphery of the wafer W' is not limited to the example illustrating a round type (R type). For example, the cross-sectional shape may be a tapered type (T type). The bevel part may be removed so as to form a surface perpendicular to the main surface of the wafer. In addition, the periphery may be formed into the desired shape according to a specification.

Figure 2:
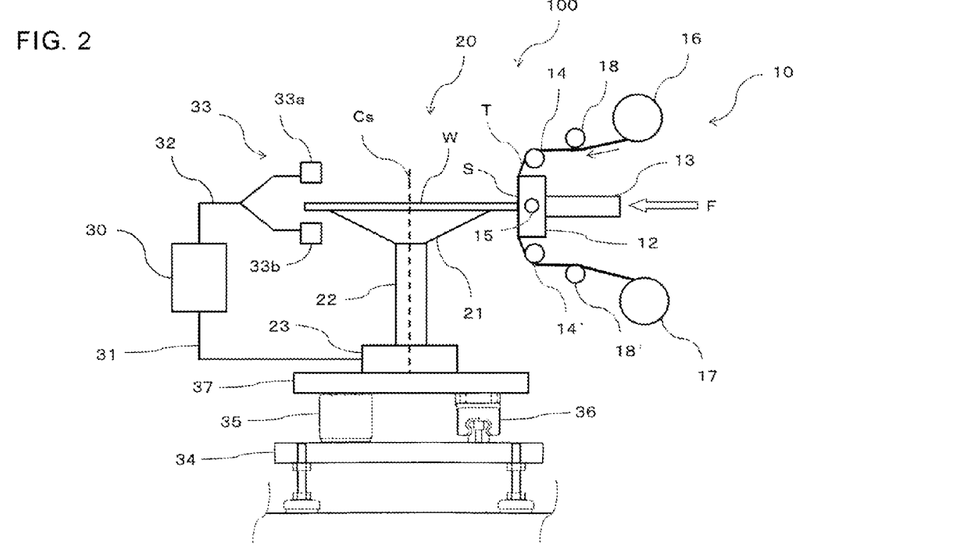
FIG. 2 schematically shows a front view of a wafer periphery polishing apparatus.

FIG. 2 schematically shows a wafer periphery polishing apparatus 100 used in the method for manufacturing a circular wafer according to the present invention.

The wafer periphery polishing apparatus 100 includes a polishing tape unit 10 and a wafer unit 20.

The polishing tape unit 10 includes a flat polishing pad (contact pad) 12 on which a polishing tape T is disposed; an air cylinder 13 for performing backup pressure, the leading end of the cylinder having the polishing pad; guide rollers 14, 14'; a supply reel 16 from which the polishing tape T is pulled out; a take-up reel 17 onto which the polishing tape T is wound up; and auxiliary rollers 18, 18'. The polishing tape T disposed on the polishing pad defines a flat polishing surface S.

The polishing pad 12 is rotatably attached to a support member (not shown) so as to rotate around a rotary shaft 15 extending in the direction from the front to the rear as shown in the figure. The polishing pad 12 rotates so that the polishing tape T disposed on the polishing pad 12—that is, the polishing surface S—is brought into contact with the periphery of the wafer W at the desired tilt. The periphery of the wafer can thereby be finish-polished to the desired cross-sectional shape.

The polishing tape T is able to run in the vertical direction between the upper and lower guide rollers 14 and 14'.

The air cylinder 13 presses the polishing surface S against the periphery of the wafer W by applying an adjusted, predetermined pressing force F in the direction of the arrow through the polishing pad 12. Adjustment of the pressing force F (backup pressure) applied by the air cylinder 13 may be performed by, for example, the device configuration disclosed in Japanese Patent No. 4463326 (patent document 3).

The polishing tape T may be obtained by coating a surface of a plastic base film with a resin binder solution in which abrasive grains are dispersed, drying and curing the coated sheet, and cutting the sheet so as to have the required width for winding on a reel.

A plastic film made from a flexible synthetic resin may be employed as the base film. Specifically, a film made from a polyester resin, including polyethylene terephthalate, polybutylene terephthalate, polyethylene naphthalate and polybutylene naphthalate; a polyolefin resin, including polyethylene and polypropylene; or an acrylic resin comprised mainly of polyvinyl alcohol or methacrylic alcohol may be employed as the base film.

For the abrasive grains (abrasive particles), materials such as alumina ($Al_2O_3$), cerium oxide ($CeO_2$), silica ($SiO_2$), diamond, silicon carbide (SiC), chromium oxide ($Cr_2O_3$), zirconia ($ZrO_2$), cubic boron nitride (cBN) or mixtures thereof can be employed.

The average particle diameter of the abrasive grains preferably ranges from 0.2 μm (#20000) to 3 μm (#4000). Abrasive grains having an average particle diameter greater than 3 μm are undesirable, because new minute scratches or chipping would be generated on the finished surface of the periphery of the wafer W, and the process would fail to provide sufficient strength for a wafer W made from a crystal material. Abrasive grains having an average particle diameter less than 0.2 μm are not industrially practicable, because the polishing efficiency would be radically reduced and productivity worsened.

Preferably, the polishing pad 12 has elasticity. For the polishing pad 12, a flat foamed resin plate having shore A hardness ranging from 20 to 50 may be employed to cushion the mechanical shock. Alternatively for the polishing pad 12, a combination of the aforementioned foamed resin plate and a rubber plate having shore A hardness ranging from 80 to 90 may be employed. By selecting the elasticity of the polishing pad 12 according to such factors as abrasive grain size, even when using a polishing tape comprising abrasive grains having an extremely small average particle diameter (for example, 1 μm or less), the periphery of the wafer can be provided with excellent surface properties without greatly reducing the polishing rate.

The wafer unit 20 has a wafer stage 21 having a horizontal upper surface on which the wafer W is disposed. The wafer stage 21 is connected to a motor 23 via a coaxial shaft 22 with a rotation axis Cs. Preferably, the motor 23 is a servo motor with an encoder. When the motor 23 operates, the wafer stage 21 is rotated with respect to its center, that is, the rotational axis Cs.

In the preferred embodiment, the wafer stage 21 is a vacuum suction stage and has a flat surface provided with one or more suction holes communicating with a vacuum pump via a pipe (not shown). The wafer W is disposed on the stage 21 via such means as an elastic pad and is vacuum-sucked so as to be fixed to the stage.

The periphery part is polished by rotating the wafer stage 21 while bringing the periphery part of the wafer W fixed on the wafer stage 21 and the polishing element (the polishing surface S) into contact with each other.

In one embodiment of the present invention, the wafer stage 21 preferably repeats forward and backward rotations within the range of a predetermined rotation angle, the range being less than one rotation (the rotation angle being smaller than 360 degrees) during the polishing step. The rotation angle of the wafer stage 21 on which the wafer W is disposed is determined so as not to reduce the roundness of a wafer W with an OF.

Preferably, the control unit 30 is connected to the motor 23 via a conductor 31, and is connected to an optical sensor 33 via a conductor 32.

The optical sensor 33 is intended to measure the radial position along the periphery of the wafer, the sensor having a light-projection part 33a and a light-receiving part 33b.

The light-projection part 33a projects parallel light having a band shape, the light advancing parallel to the rotation axis Cs in a radial direction of the wafer. The light-receiving part 33b is disposed so as to be opposed to the light-projection part 33a, with the wafer W being interposed between them. The light-projection part 33a may have a light-emitting diode element or a semiconductor laser element. The light-receiving part 33b may include a CCD (charge-coupled device) image sensor. For example, the light-receiving part 33b may include a number of compact photodiodes aligned in the radial direction of the wafer so as to receive the parallel light projected from the light-projection part 33a.

Some of the light projected from the light-projection part 33a is shaded by the wafer W. The remaining light passes through radially outside the wafer W and enters the light-receiving portion 33b. When the position of a portion of the periphery of the wafer W is radially close to the rotational axis Cs, light shaded by the wafer W is reduced. The light quantity entering the light-receiving part 33b is thereby increased. Alternatively, when the position of a portion of the periphery of the wafer W is radially away from the rotational axis Cs, light shaded by the wafer W is increased. The light quantity entering the light-receiving portion 33b is thereby reduced. The electrical quantity output from the light-receiving part 33b varies depending on the light quantity from the light-projection part 33a. The radial position of the periphery portion, which faces the optical sensor 33, is detected on the basis of the electrical quantity output from the light-receiving part 33b.

The control unit 30 is capable of determining the rotation angle on the basis of position data for both ends E1, E2 of the orientation flat OF of the wafer W (see FIG. 1 (A)), the data being obtained from the optical sensor 33 and the motor 23. For example, an angle defined by both ends E1, E2 and the center O of the wafer W can be determined as the rotation angle of the wafer stage 21. Alternatively, by determining the positions of both ends E1', E2' of the OF of the circular wafer W' having a radius smaller than that of the wafer W (see FIG. 1 (A)), an angle defined by both ends E1', E2' and the center O of the wafer W can be determined as the rotation angle of the wafer stage 21.

The control unit 30 is also capable of determining the radiuses of the wafer along the periphery part of the wafer on the basis of the radial positions of the periphery portions opposed to the optical sensor 33, respectively, thereby determining the outer shape of the wafer.

Preferably, the work unit 20 is disposed on a movable plate 37 connected to an LM guide 36 and a single-axis robot 35 disposed on a horizontal base 34, the LM guide and single-axis robot each having a linear rail extending in the direction from the front to the rear as shown in the figure. The work stage 21 can thereby oscillate along a horizontal axis extending in the direction from the front to the rear as shown in the figure.

Alternatively, the polishing tape unit 10 may oscillate by being disposed on a movable plate capable of oscillating (not shown), or may be constituted to oscillate by other means.

The wafer W is centered (with the center of the wafer W being aligned with the rotation axis Cs) on the wafer stage 21 for polishing. The centering may be carried out by simultaneously pressing the periphery of the wafer disposed on the wafer stage 21 towards the rotation axis Cs from three directions by use of rod-like jigs (not shown). Alternatively, the centering may be carried out by determining the wafer center O on the basis of the outer shape of the wafer by use of the optical sensor 30 so as to align the determined center with the rotation axis Cs by controlling the pressure of the jigs. The centering may also be carried out by other means.

The primary and secondary polishing steps of the present invention may be performed by means of the wafer periphery polishing apparatus 100 as described above. The primary and secondary polishing steps are performed by rotating the wafer stage 21 about the rotation axis Cs while bringing the polishing surface S of the polishing tape unit 10 and the periphery part of the wafer W into contact with each other with the polishing surface S being perpendicular to the radial direction of the wafer W.

Figure 3:
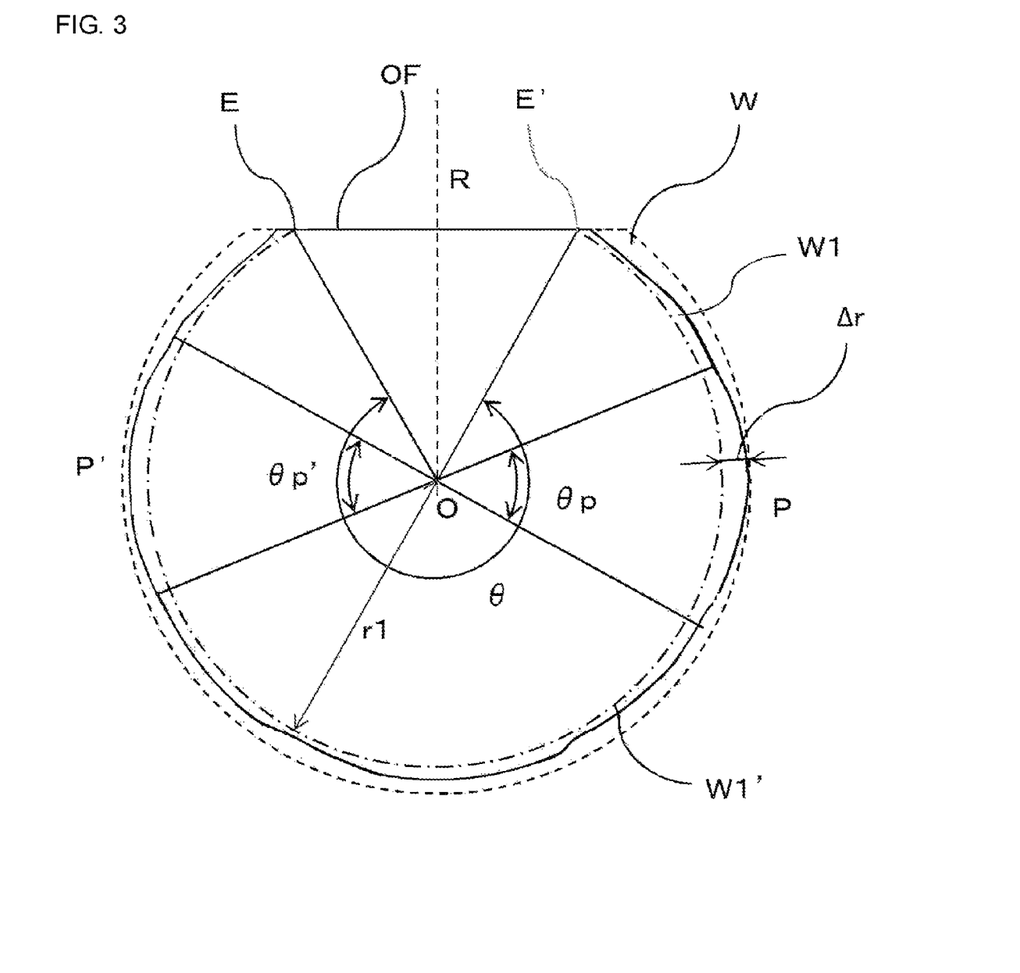
FIG. 3 is a diagram conceptually illustrating a method for manufacturing a circular wafer according to the present invention.

FIG. 3 shows a wafer W1 (the outer shape of which is shown by a solid line) formed by performing the primary polishing of the periphery (the entire circular-arc periphery part and a portion of the OF) of a wafer W (the outer shape of which is partially shown by a broken line) and a circular arc W1' (shown by a dashed line) having a radius r1 less than or equal to the minimum radius of the wafer W1.

In the primary polishing step, the wafer is preferably rotated forward and backward in the range of a predetermined rotation angle θ. The predetermined rotation angle θ may be, for example, an angle (a major angle) defined by the center O of the wafer W and two points E, E' located on the OF of the wafer W.

Alternatively, in the primary polishing step, the stage may be rotated in a fixed direction CW or CCW.

The wafer W1, which has been polished by the polishing tape in the primary polishing step, can have nonuniform outer diameters due to nonuniformity in the polishing rate caused by such factors as crystal azimuth of the wafer material. For example, depending on the wafer material, the polishing rate can be lowered in a portion of the periphery part near both ends of a diameter parallel to the OF. Radiuses r of the wafer W1 are measured along the periphery part. A predetermined radius r1 is set so as to be less than or equal to the minimum radius of the wafer W1. Differences Δr between the set radius r1 and radiuses r of the wafer W1 are determined along the periphery part of the wafer W1.

Values of Δr of the periphery part of the wafer W1 can vary according to variation in outer diameters. Periphery part portions P and P' having Δr greater than a predetermined value may be determined as portions in which the polishing rate is insufficient due to such factors as crystal azimuth, respectively. Angles θp and θp' corresponding to the periphery part portions P and P' are also determined, respectively. For example, the angles θp and θp' may be determined as angle ranges relative to the reference line R perpendicular to the OF.

The secondary polishing step is performed after determining the angles θp and θp' according to the present invention. In the secondary polishing step, the wafer stage 21 is rotated forward and backward in the range of the predetermined rotation angle θ while being oscillated along the horizontal axis parallel to the polishing surface S by oscillating the movable plate 37 (see FIG. 2). That is, regarding wafer W1, the periphery which abuts on the polishing surface S as the wafer stage 21 rotates in the range of rotation angle θ is sequentially polished during the forward and backward rotation of the wafer stage 21. And a part of the periphery abutting on the polishing surface S is polished while being oscillated relative to the polishing surface S. Thus, polishing rate of the entire polishing periphery can be improved.

In addition, during the primary polishing step, the polishing surface S and the wafer stage 21 may also be oscillated relative to each other.

During the forward and backward rotation, the rotation speed of the wafer stage 21 may be reduced in the range of angles θp and θp' among the rotation angle θ. While the speed is reduced, the wafer periphery portion corresponding to angle θp or θp' may abut on the polishing surface while being relatively oscillated by a fixed stroke, thereby preventing the portion from having a low polishing rate due to crystal azimuth and so as to obtain a circular wafer having improved roundness as compared with the wafer W1 in the secondary polishing step.

The rate of reduction of the rotation speed in the range of angles θp and θp' may be appropriately determined (e.g., 10%, 30%, 50%, 70% or 90% relative to the reference speed) based on differences of polishing rate (values of Δr).

Roundness refers to the magnitude of the deviation of an approximate circle as compared to a geometric true circle. By the minimum zone concept (MZC), the roundness can be determined by the difference between the radiuses of two concentric circles with a measuring object figure inserted between them. A coordinate of the center of the two concentric circles is found such that the difference between radiuses of the two concentric circles is smallest. Considering the coordinate of the center as the center of the measuring object figure, the roundness of the measuring object figure is defined by the difference between the radiuses of the two concentric circles (JIS B0621). For example, if the radius r1 of the circular arc W1' is equal to the minimum radius of the wafer W1, the maximum value among the measured Δr can be the roundness of the wafer W1.

When the radius of the circular arc W1' is set to be equal to the minimum radius of the wafer W1, a circular wafer having the desired roundness can be manufactured by polishing a portion P (P') of the periphery part after determining the portion P (P') having Δr larger than a predetermined value. In this case, the polishing is performed by rotating the wafer stage 21 forward and backward within the range of rotation angle θp (θp') while the polishing element (the polishing surface S) is brought into contact only with the portion of the periphery part P (P').

When the wafer W (W1) has a notch, the angle θp (θp') may be determined as an angle range relative to the reference line R passing through the center of a V-shaped notch and the wafer center O (not shown).

Figure 4A:
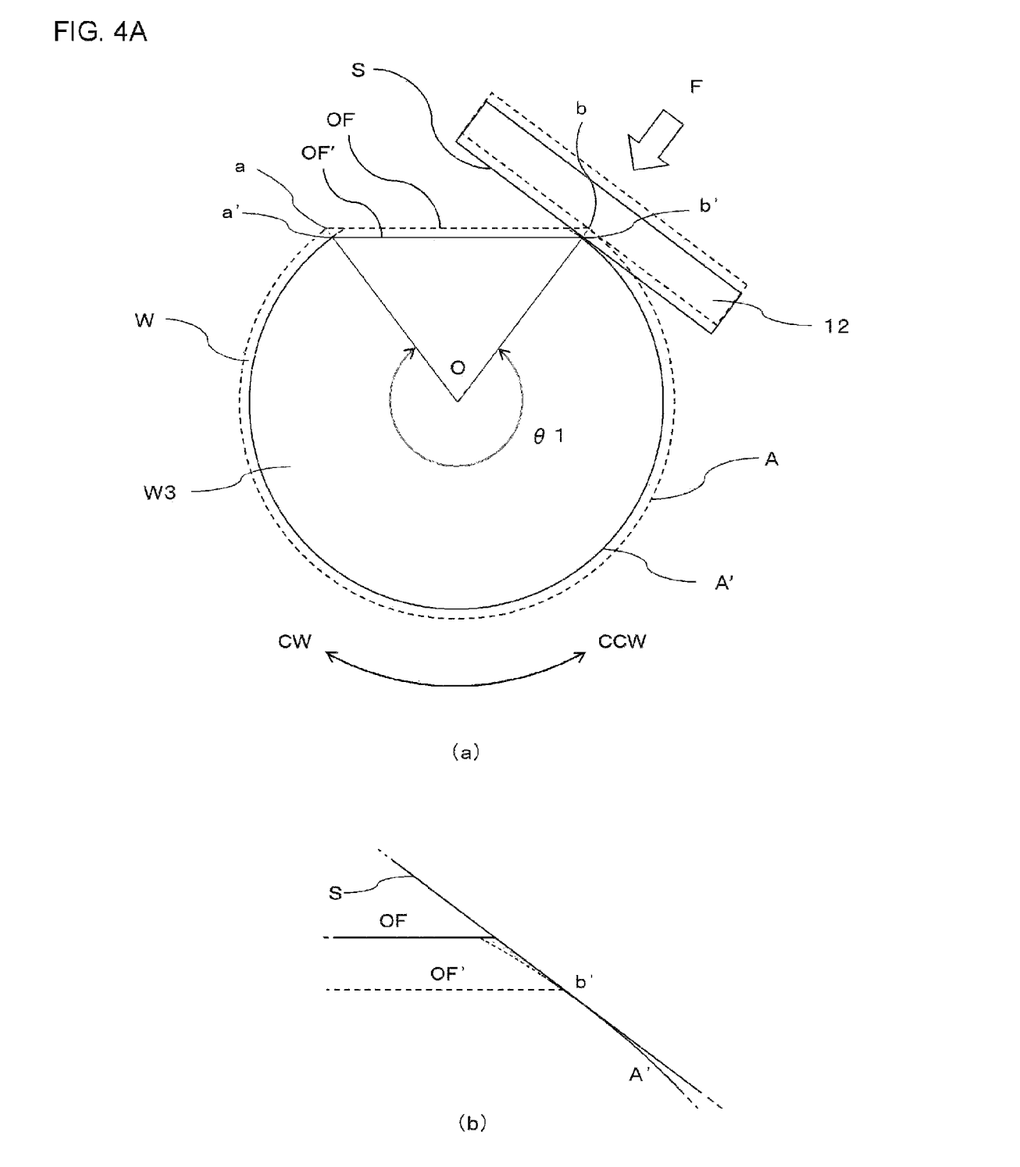

FIG. 4A (a) shows a rotation angle θ1 according to one embodiment. The angle is determined so as not to diminish the roundness in a polishing step performed with a polishing tape.

The periphery of the wafer W consists of an OF and a circular arc periphery part A, each of which is shown as a broken line. A circular wafer W3 is manufactured by polishing the entire periphery of the wafer W. The periphery of the circular wafer W3 consists of an OF' and a circular arc periphery part A'. The wafer W3 has a radius slightly smaller than that of the wafer W and has an OF length slightly shorter than that of the wafer W.

The rotation angle θ1 is set such that a portion of the circular arc periphery part is formed into a linear shape. Such rotation angle θ1 may be an angle defined by, for example, both OF ends a, b and the center O of the wafer W (or may be an angle defined by both OF' ends a', b' and the center O of the wafer W3.) Regarding the range of the rotation angle θ1, at the polishing start (or end) point and at the polishing end (or start) point, a line passing through the center O and one OF end a is perpendicular to the polishing surface S, and a line passing through the center O and the other OF end b is perpendicular to the polishing surface S, respectively. In the range of such start (end) and end (start) points, the wafer periphery is sequentially polished during the forward and reverse rotation of the wafer stage while being pressed against the polishing surface S by the predetermined pressing force F.

At the start of polishing, the entire circular-arc periphery part A abuts on the polishing surface S to be polished in a circular-arc shape. As the periphery part is polished and as the wafer radius is decreased, portions of the periphery part near both ends of the OF are out of the range of rotation angle θ1 and are polished in a straight line by the flat polishing surface S. At completion of polishing, convex portions (one of which is shown as a colored portion in FIG. 4A (b)) protruding radially outward relative to the circular-arc periphery part A' are formed at the periphery part near both ends of the OF, respectively.

Rotation angle θ1 is not limited to the illustrated example. Depending on the pressing force F or the elasticity of the polishing pad 12, the rotation angle θ1 may be defined by two points located at the periphery part A and the center O, wherein, preferably, the two points are equidistant from both ends a, b of the OF, respectively.

In a subsequent step, the circular wafer W3 having OF' is obtained by disposing the OF and the polishing surface S parallel to each other so as to be brought into contact with each other and so as to be relatively oscillated, thereby polishing the OF to remove the convex portions near both ends of the OF.

Figure 4B:
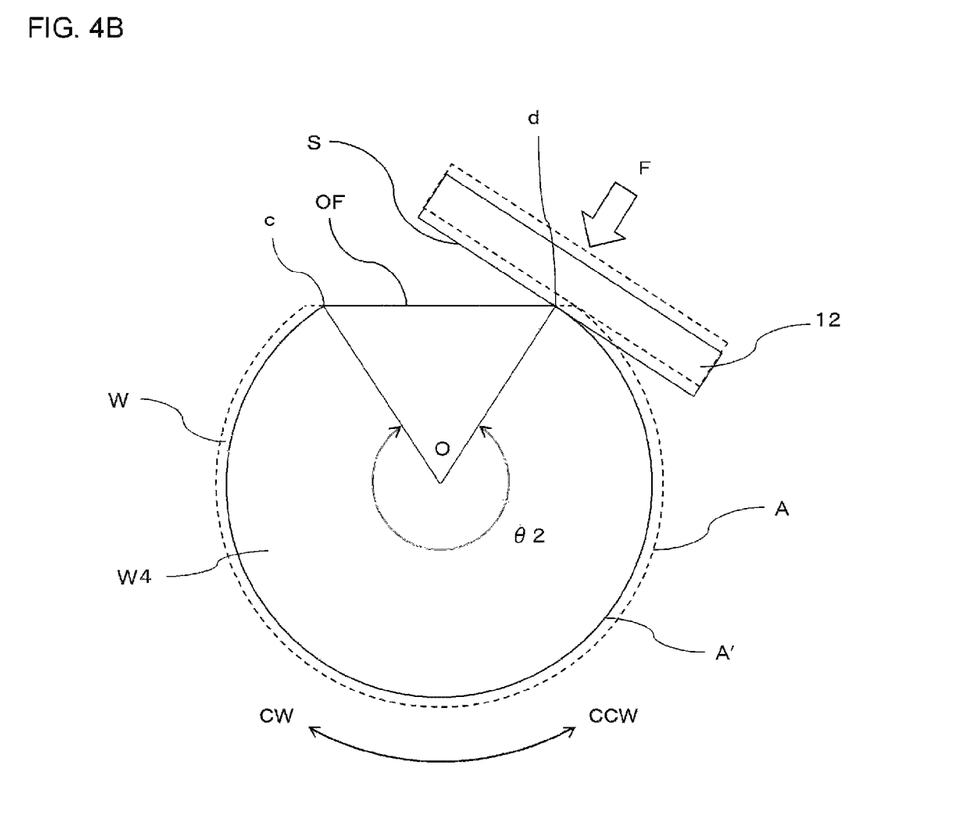
FIG. 4B is a diagram schematically showing another embodiment of a forward and backward rotation angle according to the present invention.

FIG. 4B shows a rotation angle θ2 determined so as not to diminish roundness in the polishing step using a polishing tape according to another embodiment. A circular wafer W4 is manufactured by polishing the entire circular-arc periphery part and portions of the OF of the wafer W. The wafer W4 has a radius slightly smaller than that of the wafer W and has an OF length slightly shorter than that of the wafer W. The rotation angle θ2 may be a major angle defined by the center O and two points c, d located at the OF of the wafer W (both OF ends of the wafer W4).

Regarding the range of the rotation angle θ2, the polishing start and end points (or end and start points) are positions where a line passing through the center O and one point c is perpendicular to the polishing surface S and a line passing through the center O and the other point d is perpendicular to the polishing surface S. The wafer periphery, which abuts on the polishing surface S according to the range of the start and end points as described above, is sequentially polished during the forward and backward rotation of the wafer stage.

At the start of polishing, the polishing surface S does not abut on the points c, d. At completion of polishing, the polishing surface S abuts on the points c, d, respectively. When the polishing surface S abuts on the point c or d, the rotation speed becomes almost zero, because the rotation direction is reversed, and the resulting polishing power is sufficiently reduced so as not to cause a rollover at each of the renewed ends of the OF. In addition, since the entire circular-arc periphery part is polished in a circular-arc shape throughout the polishing, the circular wafer W4 can be obtained without forming convex portions at the circular-arc periphery part near both ends of the OF.

Figure 4C:
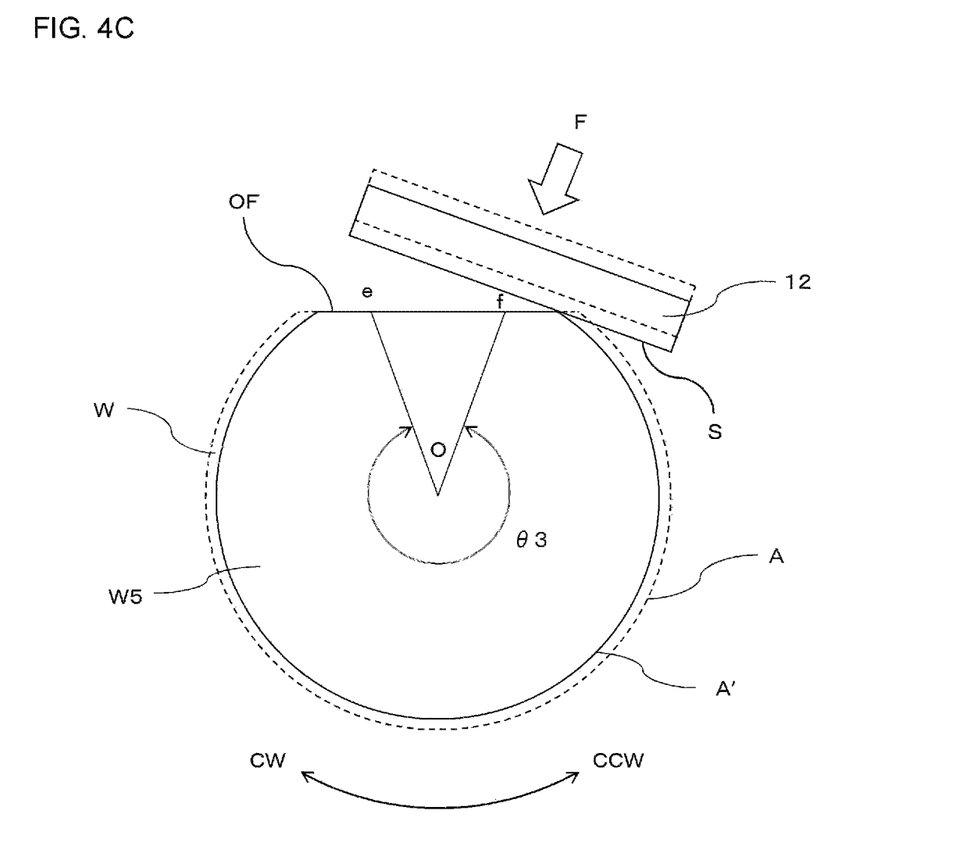
FIG. 4C is a diagram schematically showing yet another embodiment of a forward and backward rotation angle according to the present invention.

FIG. 4C shows a rotation angle θ3 determined so as not to diminish the roundness in the polishing step using a polishing tape according to yet another embodiment. A circular wafer W5 is manufactured by polishing the entire circular-arc periphery part A and portions of the OF of the wafer W. The wafer W5 has a radius slightly smaller than that of the wafer W and has an OF length slightly shorter than that of the wafer W. The rotation angle θ3 may be a major angle defined by two points e, f located at the OF of the wafer W (or the circular wafer W5) and the center O. Preferably, the distance between the point e and one end of the OF is equal to the distance between the point f and the other end of the OF.

Regarding the range of rotation angle θ3, the polishing start and end points (or end and start points) are positions where a line passing through one point e located at the OF and the center O and a line passing through the other point f located at the OF and the center O are perpendicular to the polishing surface S, respectively. The wafer periphery, which abuts on the polishing surface S according to the range of the start and end points as described above, is sequentially polished as the wafer stage rotates forward and backward. Both ends of the OF of the circular wafer W5 can be polished by rotating the stage in the range of rotation angle θ3. The polishing surface S and the periphery of the wafer W or W5 are kept in contact with each other (that is, the polishing surface S is prevented from intermittently abutting on the periphery of the wafer W or W5) by virtue of the selected pressing force or the elasticity of the polishing pad 12, and thereby the circular wafer W5 can be formed without reducing roundness.

Using the method for manufacturing a circular wafer according to the present invention and that according to a comparative example, the peripheries of 4-inch Si single crystal wafers having OFs were polished and the roundness of the respective resulting wafers was measured.

Figure 5A:
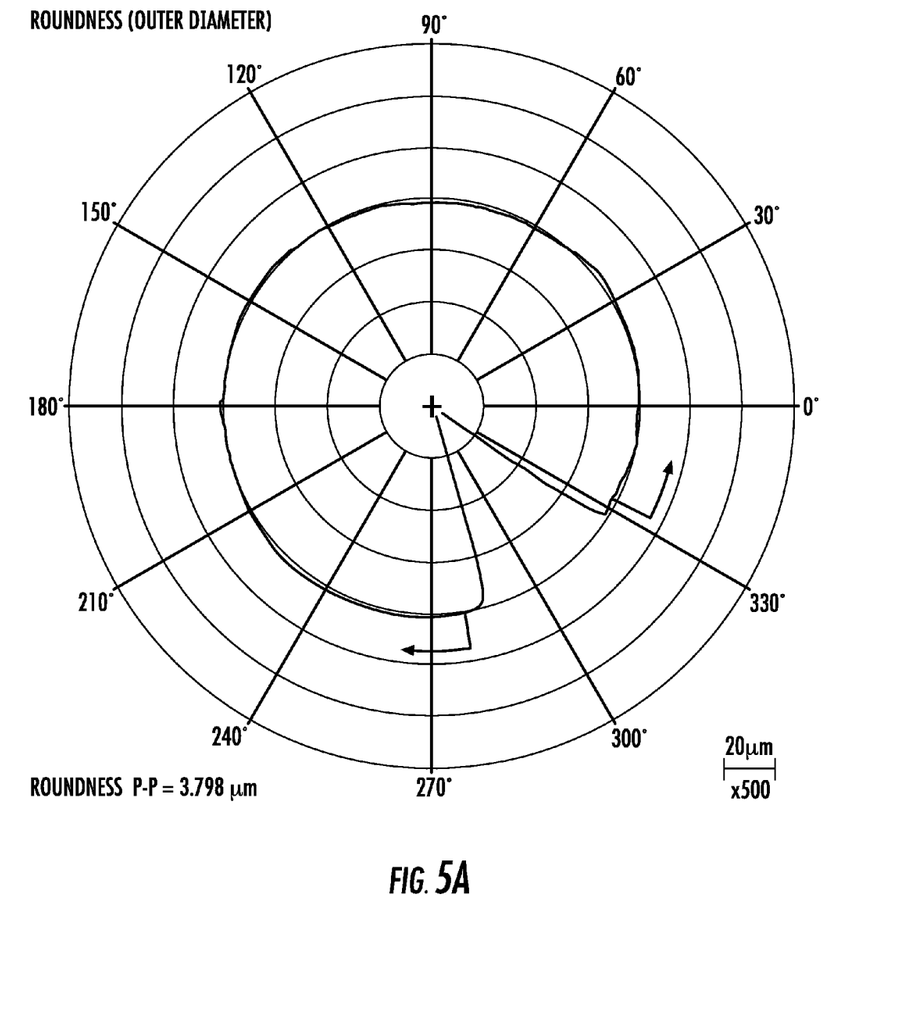
FIG. 5A shows the outer diameter and roundness of a wafer.

FIG. 5A shows the outer diameter and roundness of the Si wafer cut put from an ingot that had been cylindrically ground. The outer diameter and roundness were measured by the roundness measuring apparatus Rondcom 43C (manufactured by Tokyo Seimitsu Co., Ltd.). The roundness was measured by the MZC method using a low-pass filter (2RC) in the range indicated by the arrow (the OF being excluded from the calculation). The roundness of the Si wafer before being subjected to the polishing of the periphery thereof using the polishing tape was 3.798 μm.

THE COMPARATIVE EXAMPLE

Figure 5B:
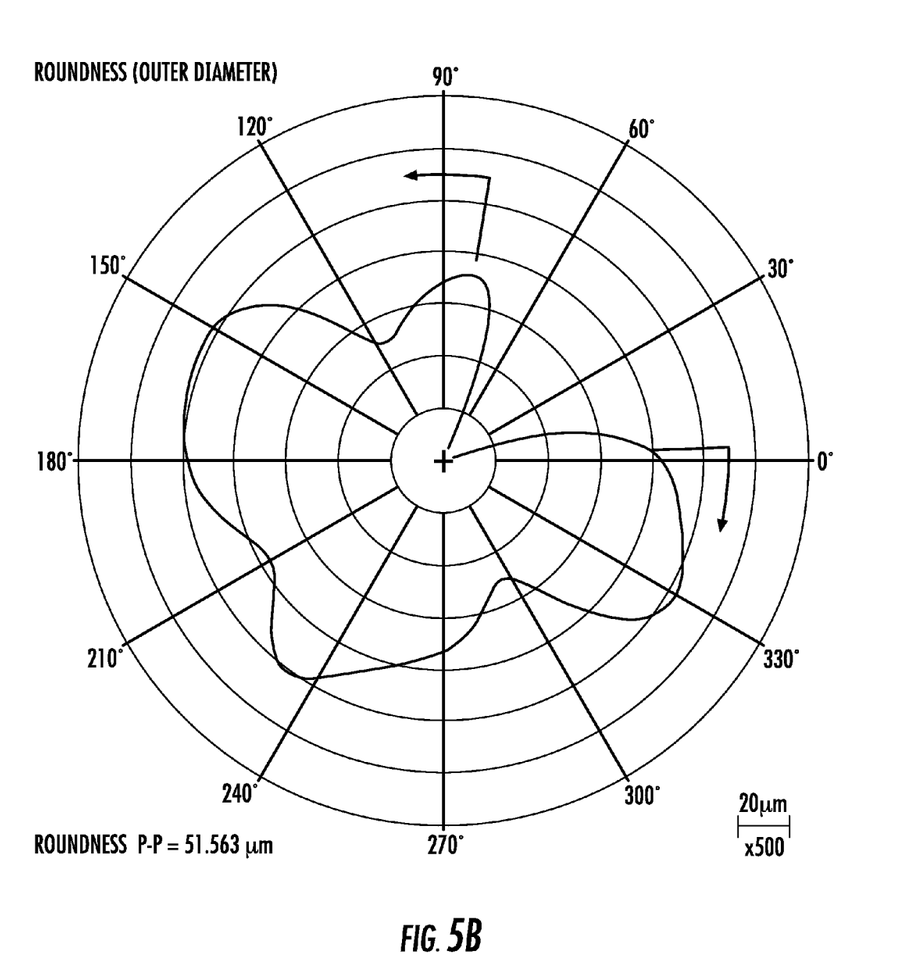
FIG. 5B shows the outer diameter and roundness of a wafer as a comparative example.

The polishing of the wafer periphery was performed by rotating the wafer stage in a fixed direction (CW) (1000 rpm, 3 minutes) with the periphery of the Si wafer, which was disposed on the wafer stage, and the polishing element (the polishing tape disposed on the polishing pad) being brought into contact with each other. As shown in FIG. 5B, in the polishing, the outer diameter/shape of the wafer was significantly changed. In particular, extreme wear was observed in one end (the shoulder part) of the OF. Since the stage was rotated only in a fixed direction, the contact between the OF of the Si wafer and the polishing element was released when they faced each other. After the contact was released, the polishing element strongly abutted on one end of the OF and subsequently weakly abutted on some circular-arc periphery due to the elasticity of the polishing pad, thereby increasing the unevenness of contact. Thus, the polishing element intermittently abutted on the wafer periphery without following the shape thereof, with the result that the roundness was significantly worsened, to 51.563 μm.

THE EXAMPLE

Figure 5C:
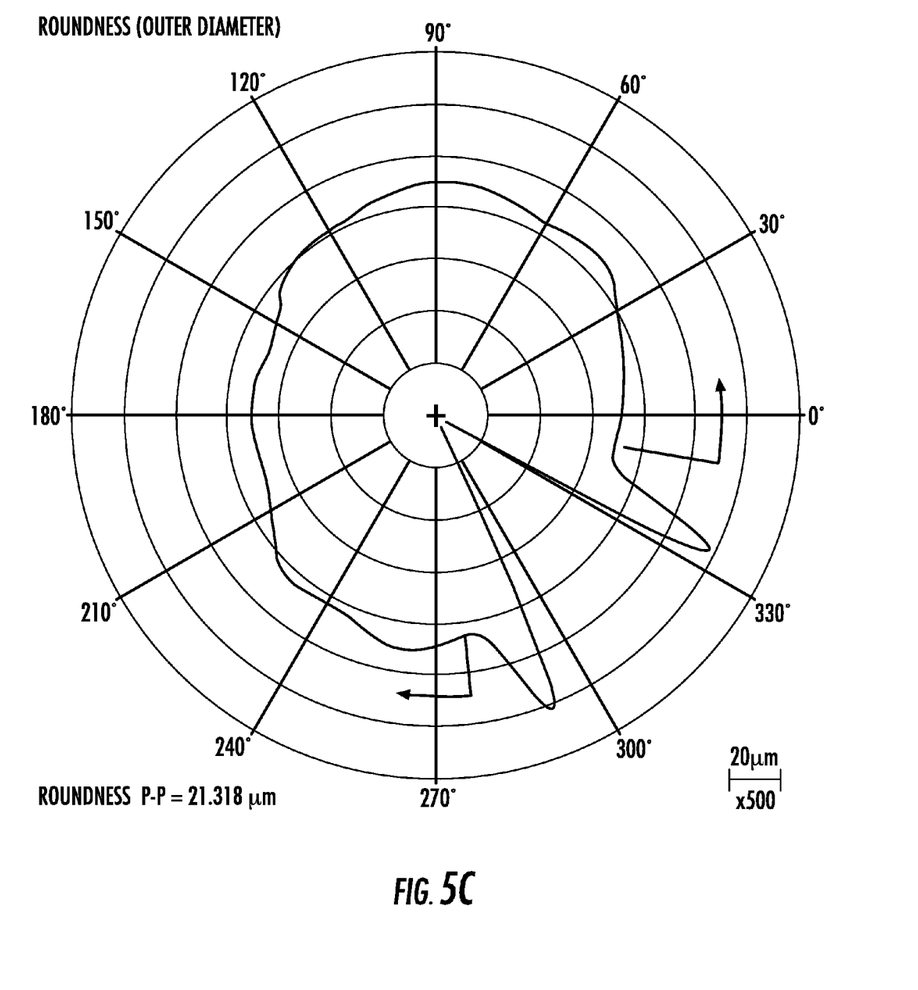
FIG. 5C shows the outer diameter and roundness of a wafer as an example of the present invention.

The polishing of the wafer periphery was performed by determining a rotation angle of the wafer stage such that a portion of the circular-arc periphery part of the wafer was formed into a linear shape (see FIG. 4A) and by repeatedly rotating the wafer stage forward and backward (3000 rpm) in the range of a determined rotation angle, with the periphery of the Si wafer, which is disposed on the wafer stage, and the polishing element (the polishing tape disposed on the polishing pad) being brought into contact with each other. As shown in FIG. 5C, the change in the outer diameter/shape was small. The roundness was 21.318 μm, thereby sufficiently meeting the specification. Then, the OF was polished such that convex portions near both ends of the OF were removed, and thereby a circular wafer was manufactured.

It will be understood by a person skilled in the art that a wide variety of modifications can be made without departing from the spirit and scope of the invention. The embodiments of the present invention are intended only for the purpose of illustration and are not intended to limit the scope of the invention.

REFERENCE NUMERALS

W wafer 1
W1 wafer 2
W1' set circular arc
O center of wafer
OF orientation flat
E, E' two points located at wafer W's OF
R reference line
P, P' portions of periphery part
r1 set radius
Δr difference between radiuses
θ forward and backward rotation angle
θp, θp' angles corresponding to portions of periphery part

The invention claimed is:

1. A method for manufacturing a circular wafer by polishing the periphery of a disc-shaped wafer comprising a crystal material by use of a polishing tape, the periphery having an orientation flat and a periphery part, comprising:
a primary polishing step for polishing the periphery part of a wafer centered on a horizontal wafer stage having a vertical rotation axis by rotating the wafer stage with the periphery part and a polishing element being brought into contact with each other;
a determining step for determining differences Δr between measured radiuses and a set radius along the periphery part, the measured radiuses being obtained by measuring radiuses of the wafer along the periphery part, the wafer having been subjected to the primary polishing and the set radius being less than or equal to the minimum radius among the measured radiuses;
a determining step for determining a portion of the periphery part of the wafer subjected to the primary polishing, the portion having Δr greater than a predetermined value; and
a secondary polishing step for polishing the periphery part subjected to the primary polishing by rotating the wafer stage forward and backward about the rotation axis in the range of a predetermined rotation angle with the periphery part of the wafer subjected to the primary polishing and a polishing element being brought into contact with each other;
wherein the polishing element comprises a polishing tape disposed on a flat polishing pad to define a flat polishing surface, and
wherein, in the secondary polishing step, the orientation flat is not parallel to the polishing surface when they face each other, the wafer stage and the polishing surface are relatively oscillated along a horizontal axis, and the speed of the forward or backward rotation of the wafer stage is reduced in the range of a rotation angle corresponding to the determined portion of the periphery part of the wafer.

2. A method for manufacturing a circular wafer as set forth in claim 1,
wherein, in the secondary polishing step, the wafer stage is rotated forward and backward in the range of a rotation angle to form a portion of the circular-arc periphery part of the wafer into a linear shape.

3. A method for manufacturing a circular wafer as set forth in claim 2, further comprising:
polishing of the orientation flat by linearly oscillating the orientation flat and the polishing surface relative to each other along a horizontal axis while they are brought into contact with each other.

4. A method for manufacturing a circular wafer as set forth in claim 1,
wherein, in the secondary polishing step, the wafer stage is rotated forward and backward in the range of a rotation angle to form the entire circular-arc periphery part of the wafer into a circular arc shape.

5. A method for manufacturing a circular wafer as set forth in claim 1,
wherein the wafer is a semiconductor wafer.

6. A method for manufacturing a circular wafer by polishing the periphery of a disc-shaped wafer comprising a crystal material by use of a polishing tape, the periphery having an orientation flat and a periphery part, comprising:
polishing of the periphery part of a wafer centered on a horizontal wafer stage having a vertical rotation axis by rotating the wafer stage forward and backward about the rotation axis in the range of a predetermined rotation angle, with the periphery part and a polishing element being brought into contact with each other;
wherein the polishing element comprises a polishing tape disposed on a flat polishing pad to define a flat polishing surface, and
wherein, in the polishing, the orientation flat is not parallel to the polishing surface when they face each other, the wafer stage and the polishing surface are relatively oscillated along a horizontal axis, and the speed of the forward or backward rotation of the wafer stage is reduced in the range of a rotation angle corresponding to a predetermined portion of the periphery part of the wafer.

7. A method for manufacturing a circular wafer by polishing a circular-arc periphery of a disc-shaped wafer comprising a crystal material by use of a polishing tape, comprising:
determining differences Δr between measured radiuses and a set radius of a wafer along a circular-arc periphery, the measured radiuses being obtained by measuring radiuses of the wafer along the circular-arc periphery, the set radius being less than or equal to the minimum radius among the measured radiuses;

determining a portion of the periphery of the wafer, the portion having Δr greater than a predetermined value; and polishing the portion of the periphery of the wafer centered on a horizontal wafer stage having a vertical rotation axis by rotating the wafer stage forward and backward about the vertical rotation axis in the range of a rotation angle corresponding to the portion of the periphery, with the portion of the periphery and a polishing element being brought into contact with each other, wherein the polishing element comprises a polishing tape disposed on a flat polishing pad to define a flat polishing surface.

8. A method for manufacturing a circular wafer by polishing the periphery of a disc-shaped wafer comprising a crystal material by use of a polishing tape, the periphery having an orientation flat and a periphery part, comprising:

polishing of a periphery part of a wafer centered on a horizontal wafer stage having a vertical rotation axis by rotating the wafer stage forward and backward in the range of a predetermined rotation angle, with the periphery part and a polishing element being brought into contact with each other, wherein the polishing element comprises a polishing tape disposed on a flat polishing pad to define a flat polishing surface, and wherein, in the polishing, the orientation flat of the wafer is not parallel to the polishing surface when they face each other.

9. A method for manufacturing a circular wafer as set forth in claim 8, wherein, in the polishing, the wafer stage is rotated forward and backward in the range of a rotation angle to form a portion of a circular-arc periphery part of the wafer into a linear shape.

10. A method for manufacturing a circular wafer as set forth in claim 9, further comprising:

polishing of the orientation flat by linearly oscillating the orientation flat and the polishing surface relative to each other along a horizontal axis while they are brought into contact with each other.

11. A method for manufacturing a circular wafer as set forth in claim 8, wherein, in the polishing, the wafer stage is rotated forward and backward in the range of a rotation angle to form the entire circular-arc periphery part of the wafer into a circular arc shape.

12. A method for manufacturing a circular wafer as set forth in claim 11, wherein, in the polishing, the polishing surface is pressed against the periphery part of the wafer via a polishing pad having elasticity such that the polishing surface and the periphery of the wafer do not release their contact.

* * * * *